SEMICONDUCTOR DEVICE AND METHOD FOR THE FABRICATION THEREOF

Filed March 15, 1962 2 Sheets-Sheet 1

INVENTOR.
JACK M. HIRSHON
BY
Albert L. Free
ATTORNEY

Aug. 9, 1966 J. M. HIRSHON 3,265,542

SEMICONDUCTOR DEVICE AND METHOD FOR THE FABRICATION THEREOF

Filed March 15, 1962 2 Sheets-Sheet 2

INVENTOR.
JACK M. HIRSHON
BY
Albert L. Free
ATTORNEY

United States Patent Office 3,265,542
Patented August 9, 1966

3,265,542

SEMICONDUCTOR DEVICE AND METHOD FOR THE FABRICATION THEREOF

Jack M. Hirshon, Buckingham, Pa., assignor to Philco Corporation, Philadelphia, Pa., a corporation of Delaware Filed Mar. 15, 1962, Ser. No. 179,973
3 Claims. (Cl. 148—175)

This invention relates to silicon semiconductor devices and to methods for making them.

It is known in the prior art that junctions between semiconductive materials of different conductivity types, for example, PN, NI, and PI junctions, can be made so that they act as rectifiers of electrical current. Such junctions are commonly produced by the alloying or diffusion of dopant impurities into semiconductive bodies. Another method which has been proposed for making semiconductor junctions employs epitaxial growth of a layer of semiconductive material of given conductivity-type on a base body of different conductivity-type so that the grown layer and the underlying material together form a single-crystal junction. This method is of particular interest because it permits very accurate control of the resistivity gradient in the growth region and because it lends itself readily to mass-production and microelectronic techniques.

More particularly, it has been proposed in the prior art to place an apertured template or mask over a surface of a body of silicon of one conductivity type, to provide epitaxial-growth of silicon of opposite conductivity type on the portions of the silicon body exposed through said template, and then to remove the template. Each discrete epitaxially-grown region then forms a separate PN junction with the original underlying silicon. In this manner a large number of PN rectifier elements can be made at one time on a single substrate of silicon and then cut apart into a number of separate rectifier units. Alternatively, the epitaxially-grown regions can be provided in arrays having geometries and interconnections suitable for use in microelectronic circuitry. The epitaxial-growth method also has the advantage of lending itself readily to the formation of successive silicon layers of differing conductivities or electrical characteristics so that any of a large number of complex semiconductor devices may, in theory, be fabricated by this technique.

However, the above-described epitaxial technique for forming rectifying junctions on silicon has heretofore had the important disadvantage that the rectifying characteristics of the junctions existing after the epitaxial-growth step were so poor as to be unusable for many important practical purposes. In many applications of semiconductor PN rectifiers it is desirable or essential that the reverse current of the rectifier remain extremely low with increasing reverse voltage, until it finally rises sharply at a definite and high breakdown-voltage, and that the forward current of the rectifier rise as rapidly as possible with increases in forward voltage. When in the prior art it was attempted to make PN junction rectifiers by epitaxial-growth of junctions through a template without further treatment, the reverse currents of the resultant rectifiers were much higher than the maximum permissible for many important purposes and the reverse breakdown-voltage was gradual, beginning at relatively low voltages. While these current characteristics could be improved by various subsequent treatments such as clean-up etching and surface passivating techniques, the need for such additional steps was costly and time-consuming, and introduced possibilities for contamination or loss of accuracy of delineation of the junctions. In addition, even after such treatment the resultant electrical characteristics were of lower quality than would be desirable for certain applications. Accordingly the epitaxial-growth technique has not heretofore fulfilled its promise as a technique for making junction rectifiers for use as diodes or transistor elements.

Accordingly, it is an object of my inventino to provide a new and improved method for the fabrication of semiconductive devices.

Another object is to provide a new and improved method for producing junctions in semiconductive silicon bodies.

A further object is to provide a method for producing rectifying junctions of low reverse current by epitaxial growth of silicon semiconductive materials.

Still another object is to provide a method for fabricating a plurality of rectifying junctions by epitaxial-growth of silicon, which junctions have low reverse currents and are formed in predetermined patterns on a silicon body.

It is still another object to provide a new silicon rectifying device.

In accordance with the invention the above-described objects are achieved by a process in which an adherent layer of an insulating oxide of silicon is provided over a part only of a silicon body, leaving exposed a portion of the silicon body contiguous the oxide layer, and silicon of conductivity suitable for producing a rectifying junction with the underlying silicon body is then grown epitaxially upon the exposed silicon contiguous the edge of the silicon oxide layer. Preferably the exposed regions of the silicon body are provided by one or more apertures extending through the silicon oxide and produced by photolithographic techniques. These apertures may be arranged to provide an assembly of epitaxially-grown rectifying elements designed to be operated together as a single functional unit, or to provide an arrangement of such diodes which can easily be cut apart into subgroups or single-diode units for individual use. The epitaxial-growth is preferably provided by vapor deposition of silicon involving the hydrogen reduction of silicon tetrachloride, or other silicon halide, with any desired metallic impurity element being added during deposition by the simultaneous hydrogen reduction of a halide of the impurity metal. After the epitaxial-growth step suitable contacts to the opposite sides of the junction may be provided, as by ordinary evaporation of a metal through a mask. The oxide layer at the periphery of the epitaxially-grown silicon is left adhering to the silicon after the device is completed and during use.

My method provides the advantages of convenient junction location and delineation, compatability with microelectronic processes and structures, and control of resistivity which are characteristic of epitaxial-junction formation. In addition, and importantly, my process produces junctions which are practical rectifiers of excellent electrical characteristics without requiring any surface treatment steps after the epitaxial-growth step. The junctions formed between the epitaxially-grown silicon and the underlying silicon exhibit from the beginning, and retain thereafter, the low reverse-current and the abrupt, high-voltage reverse breakdown which are important or essential for many applications of such devices. This advantage is produced by a special cooperation occurring between the silicon oxide layer defining the junction regions and the epitaxially-grown layer of silicon forming the exterior part of the junction. It is believed that when the epitaxial growth is conducted in the presence of the bounding layer of silicon oxide, the periphery of the rectifying barrier thus produced extends somewhat under the edge of the adjacent silicon oxide. The peripheral portion of the rectifying barrier is therefore never exposed at a surface of the device, but instead is always covered by a protective and passivating layer of silicon oxide. This substantially eliminates the leakage of current across the surface of the junction which produces the undesirably-high reverse-current characterizing prior-art junctions produced by epitaxial-growth without further treatment.

Other objects and features of the invention will be more fully understood from a consideration of the following detailed description taken in conjunction with the accompanying drawings in which.

Figure 9A:
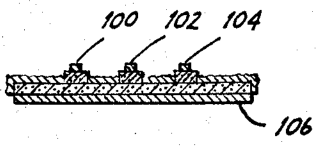
FIGURES 9A and 9B are sectional and plan views respectively of the structure of FIGURE 7 after suitable electrical connections have been applied thereto.
Figure 9B:
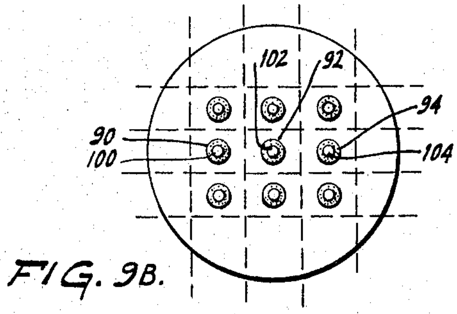
Figure 10:
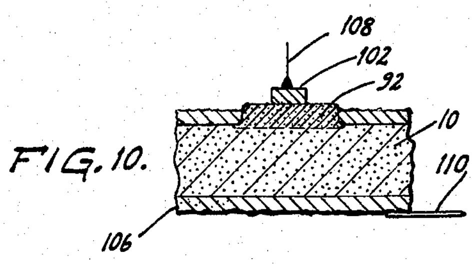
Figure 11:
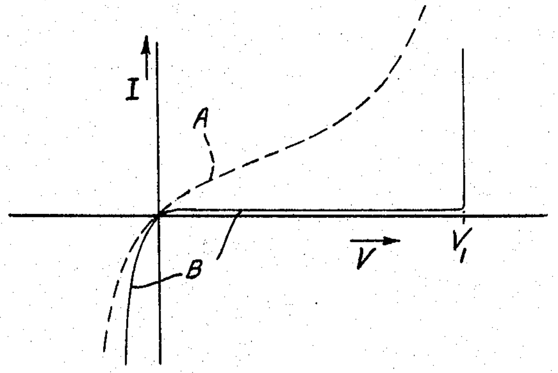

FIGURE 10 is a sectional view of one completed semiconductor device cut from the assembly of elements shown in FIGURES 9A and 9B; and FIGURE 11 is a graphical representation showing in dashed line the current-voltage characteristic of a rectifier fabricated by epitaxial techniques of the prior art, and showing in full line the current-voltage characteristic typically produced by a device fabricated in accordance with the process described hereinafter with reference to the preceding figures.

Figure 1A:
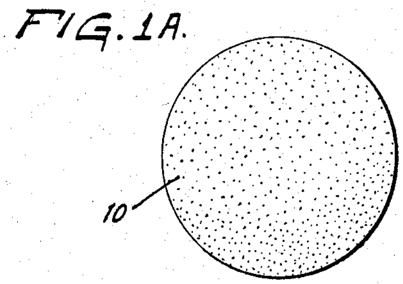
FIGURES 1A and 1B are plan and sectional views, respectively, of a wafer of silicon upon which the process of the invention may be performed.
Figure 1B:
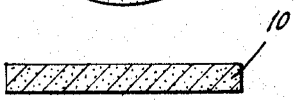

The invention will now be described, by way of example only, with respect to one preferred embodiment thereof illustrated in the several figures, which are not necessarily to scale and in which like parts are designated by like numerals. Referring to FIGURES 1A and 1B, the starting material may be a circular wafer 10 of silicon, in this case of N-type conductivity, having a resistivity of about 0.2 to 4 ohm-centimeters and a crystal orientation about 0.5° to 4° from the 1,1,1 crystal orientation. It will be understood that the exact size and shape of the wafer is not of critical importance and may be selected to permit the formation thereon of the desired number of rectifying elements. In this example the wafer may be about ¾ inch in diameter, mechanically lapped to a thickness of about ten mils and polished. It is then given a light etch in a solution of hydrofluoric, nitric and acetic acid to clean the surfaces of the wafer and to remove any damage produced on the crystal surface by the preceding lapping and polishing. This clean, unstressed condition of the surface is maintained during the succeeding formation of the silicon oxide layer over the surfaces thereof.

Figure 2:
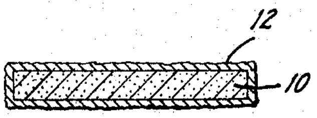
FIGURES 2, 3A, 4 and 5 are sectional views

As shown in FIGURE 2, an adherent insulating layer 12 of silicon oxide is formed over the surface of wafer 10. This oxide layer is primarily silicon dioxide and will be so designated hereinafter. While the silicon dioxide layer may be formed by other known methods, such as chemical deposition, I prefer to form it by thermal growth. This technique is well known in the art and hence need not be described here in detail. Typically the prepared silicon wafer is maintained at about 1200° C. in oxygen for about 16 hours, or in a mixture of air and steam for about ½ hour, to form an oxide layer having a thickness of the order of 10,000 angstroms.

Figure 3A:
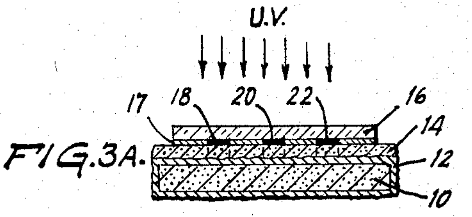
Figure 3B:
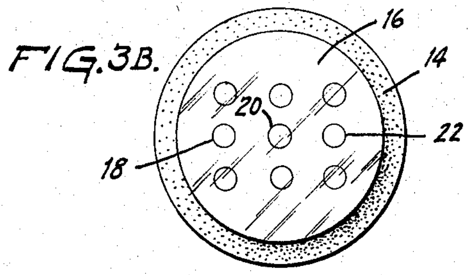
FIGURE 3B is a plan view, illustrating results of steps in my process prior to the epitaxial growth of silicon upon the silicon wafer.

Next, apertures in the oxide layer are formed to expose the underlying silicon in regions in which rectifying elements are to be made. This can readily be done by known photolithographic techniques, one example of which is as follows: As illustrated in FIGURES 3A and 3B the silicon wafer 10 bearing the silicon dioxide layer 12 is covered on its upper surface with a conventional photolithographic resist 14 over which is laid a glass mask 16 having an emulsion 17 thereon which is opaque to ultraviolet light in a plurality of circular regions such as 18, 20 and 22. As shown in FIGURE 3B, other opaque regions may also be provided and used in the same way as regions 18, 20 and 22. However, since the latter regions are representative it is sufficient and convenient to describe the process with detailed reference to these three regions alone. Parallel rays of ultraviolet light are directed onto the upper surface of the mask 16 so that the entire layer of resist 14 is exposed to ultraviolet light except for those portions in registry with the opaque regions such as 18, 20 and 22. The glass mask 16 is then removed and the underlying assembly, consisting of wafer 10, oxide layer 12, and exposed resist layer 14, is rinsed in a suitable developer solution which removes the portions of the resist which were not exposed to the ultraviolet light, i.e. the portions underlying the opaque regions of the mask. The resulting assembly is shown in FIGURE 4, and includes the apertures 26, 28 and 30 in the resist formed in registry with the opaque portions 18, 20 and 22 of mask 16.

Figure 4:
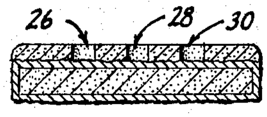
Figure 5:
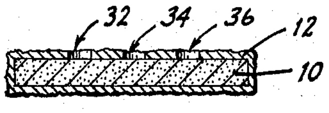

The assembly of FIGURE 4 is then immersed in an etchant solution which dissolves silicon dioxide, such as a solution of buffered hydrofluoric acid, to form the apertures 32, 34 and 36 in the oxide layer 12 in the regions exposed by the resist, and the remaining resist is dissolved and washed off to produce the assembly shown in FIGURE 5, comprising the silicon wafer 10 and the overlying silicon dioxide layer 12 having therein the circular apertures 32, 34 and 36 through which the underlying silicon is exposed. By the foregoing method the locations and sizes of the apertures in the silicon oxide can be easily controlled, aperture diameters of from 5 mils to 200 mils being typical for various applications. In the present case a diameter of about 5 mils will be assumed for the sake of definiteness.

Figure 6:
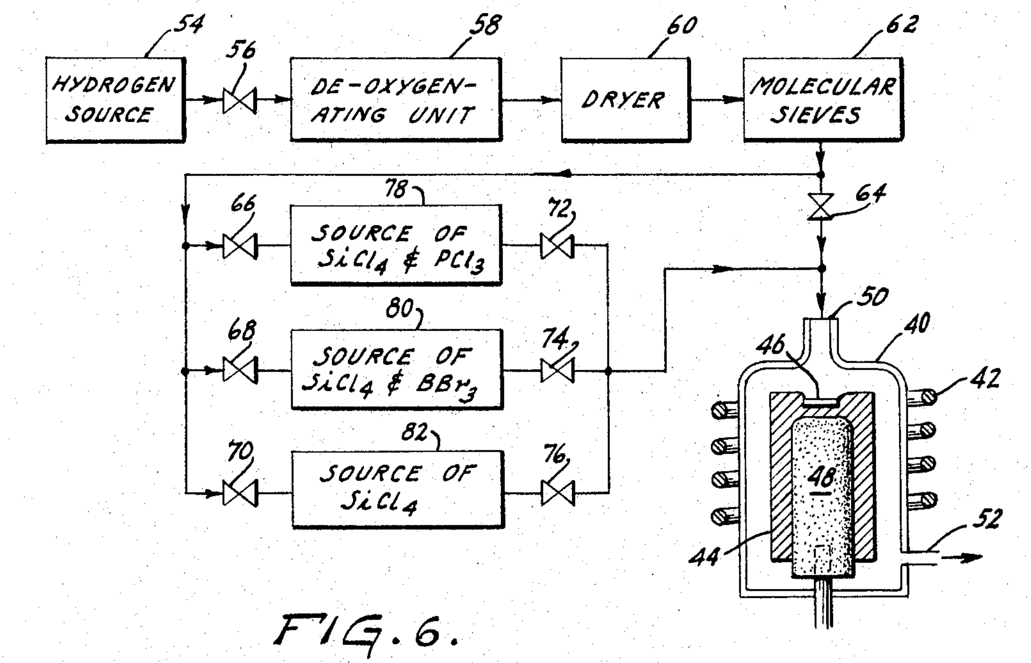
FIGURE 6 is a schematic representation, partly in block form, illustrating apparatus suitable for performing the step of epitaxial growth of silicon pursuant to the process of the invention.

The next step is to grow P-type silicon epitaxially on the N-type silicon exposed through the apertures 32, 34 and 36 in the oxide layer. Various methods for performing such epitaxial growth are well known in the art. I prefer to utilize for the purpose a vapor deposition process making use of the hydrogen reduction of $SiCl_4$ and of a halide of the impurity metal which is to be introduced into the silicon. Such a method is described in detail for example in an article by H. C. Theurer in the Journal of Electrochemical Society, vol. 108, p. 649 (1961). One typical arrangement for performing such epitaxial growth is represented in FIGURE 6 hereof and comprises a chamber 40, having water-cooled walls, which is surrounded by a radio-frequency heating coil 42. The chamber contains a quartz pedestal 44 for supporting the silicon wafer 46 which is to be subjected to epitaxial growth, and a graphite cylinder 48 within the pedestal, in which cylinder heating currents are induced by operation of the RF heating coil 42 in conventional manner. It is understood that wafer 46 represents the semi-conductor assembly of FIGURE 5, although the details of the silicon oxide layer are not shown in FIGURE 6. A gas inlet 50 and a gas outlet 52 permit establishment of gaseous flow through the chamber 40.

The vehicle gas utilized in the process is hydrogen, which is provided by any suitable source 54 of hydrogen under appropriate pressure. By opening a gas valve 56 the hydrogen is permitted to flow through a deoxygenating unit 58, dryer 60, and an assembly of molecular sieves 62 which may be operated at −195° C. These elements operate in conventional manner to remove oxygen from the hydrogen gas, to dry the gas, and to remove other condensable gaseous impurites which may be present in the hydrogen. As a result the hydrogen gas emanating from the molecular sieve assembly 62 is extremely pure. By opening the valve 64 and closing valves 66, 68, 70, 72, 74 and 76, the hydrogen gas may be caused to flow directly through the chamber 40 when it is desired to flush out the system.

With the arrangement shown in FIGURE 6 epitaxial growth can be provided on wafer 46 in any of the following three different ways.

First, N-type silicon can be grown on wafer 46 by closing all valves except 56, 66 and 72 so that the hydrogen gas is forced to flow from the sieves 62 through the source 78 of silicon tetrachloride and phosphorus trichloride and thence to the inlet 50 of chamber 40. In passing through source 78 the hydrogen picks up small quantities of silicon tetrachloride and phosphorus trichloride and carries them to chamber 40 where, at a temperature of 1200° to 1400° C., the hydrogen reduces the $SiCl_4$ and $PCl_3$ to produce free silicon and free phosphorus. The free silicon and phosphorus then deposit on wafer 46 and form thereon a single-crystalline extension comprising silicon doped with phosphorus to make it N-type.

Secondly, P-type silicon can be grown epitaxially on wafer 46 by closing all valves except 56, 68 and 74 so that the hydrogen passes through the source 80 of silicon tetrachloride and boron tribromide before reaching chamber 40. In this case silicon containing boron grows as a single-crystalline extension on wafer 46 to provide a P-type layer thereon.

Finally, high-resistivity or substantially intrinsic silicon can be grown on wafer 46 by closing all valves except 56, 70 and 76 so that before reaching chamber 40 the hydrogen passes through the source 82 of $SiCl_4$ which contains no dopant impurity. In this case pure silicon is grown epitaxially on wafer 46 in chamber 40.

With proper adjustment of the concentration of $SiCl_4$ in the hydrogen, silicon will deposit on the parts of the silicon body exposed through the apertures in the oxide layer thereon but not over the surrounding oxide.

One specific procedure for performing such epitaxial growth is as follows: The semiconductor wafer assembly shown in FIGURE 5 is cleaned by scrubbing with detergent, applying ultrasonic cleaning techniques, rinsing for a few seconds in buffered hydrofluoric acid and then rinsing in deionized water. The hydrofluoric acid serves to remove any thin oxide layer which may form on the exposed silicon surface regions due to contact with room air through apertures 32, 34 and 36, so that the underlying silicon wafer 10 will be exposed directly to the epitaxial growth conditions. For this reason the previously-formed silicon dioxide layer 12 should be made originally sufficiently thick that, after the assembly is cleaned with HF, the thickness of layer 12 still remaining provides the desired masking action.

After the above-mentioned water rinse the assembly shown in FIGURE 5 is blown dry with clean nitrogen and, if it is to be stored for a short period of time, is kept in a clean nitrogen atmosphere. Preferably it is placed promptly in a chamber 40 in the position shown at 46. The system while cold is flushed out thoroughly with hydrogen from source 54, which flows through valve 64 without passing through the sources of $SiCl_4$ and other impurities. As the hydrogen flow is continued the RF heater 42 is operated to bring the temperature of the silicon wafer 46 into a range of from about 1200° to 1400° C., where it is kept for about ten minutes before the valve 64 is closed and valves 68 and 74 opened so that the hydrogen flows through the silicon tetrachloride and boron tribromide. This flow is continued for a time depending upon the thickness of the P-type silicon layer which is to be grown epitaxially. Times of from 10 seconds to 5 minutes are typical with a flow rate of approximately 1 to 2 liters per second, although much longer times may also be used. The epitaxial silicon grows at the rate of about 1 to 3 microns per minute, and in the present example the process may be continued for about 1 minute to grow a two-micron thick P-type layer on the underlying N-type silicon through the apertures 32, 34, 36. The resulting epitaxially-grown P-type material has a resistivity of from about 0.001 ohm-centimeter to about 0.01 ohm-centimeter. At this point the valves 68 and 74 are closed, valve 64 opened to permit hydrogen alone to pass through the chamber 40, and the heating discontinued so that cooling of chamber 40 and the semiconductor assembly occurs in the hydrogen atmosphere.

The amount of silicon tetrachloride in the hydrogen during the above-mentioned process may be controlled by changing the temperature of the material source 80, and the amount of boron, which in turn determines the resistivity of the grown silicon, may be controlled by selection of the percentage of boron tribromide included in source 80. Typically the amount of boron is of the order of 0.1 to 100 parts per million of silicon tetrachloride. When the chamber 40 has been cooled the wafer is removed and cleaned in a detergent, rinsed in deionized water and blown dry.

Figure 7:
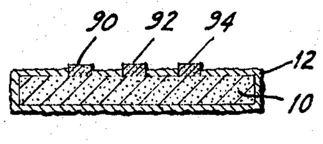
FIGURE 7 is a sectional view of a device in the course of fabrication in accordance with the invention, after epitaxial growth has been performed thereon in the apparatus of FIGURE 6.
Figure 8:
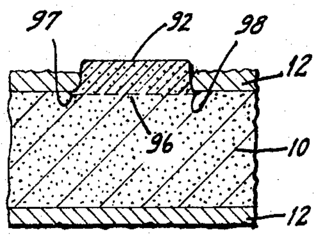
FIGURE 8 is an enlarged sectional view of a portion of the device shown in FIGURE 7, illustrating in more detail the epitaxially-grown portion of the device.

The resultant structure is shown in FIGURE 7, wherein the epitaxially-grown P-type regions 90, 92 and 94 have been formed on the underlying silicon within the apertures formerly existing in the silicon oxide layer 12. One of these epitaxially-grown regions 92 is shown enlarged in FIGURE 8, the retifying junction between the grown P-type region and the underlying N-type region being indicated by the dashed line 96. As shown at 97 and 98, the periphery of this rectifying PN junction extends slightly under the oxide layer 12, so that silicon dioxide immediately covers the portion of the PN junction which would otherwise be exposed to the atmosphere and exerts thereon a passivating and protecting effect which prevents excessive surface leakage current across the junction when it is reverse-biased.

FIGURES 9A and 9B show, respectively, a sectional view and a plan view of the assembly of FIGURE 7 after aluminum connections 100, 102, and 104 have been applied to epitaxially-grown regions 90, 92 and 94 respectively, as by ordinary evaporation through a mask followed by momentary heating to effect bonding, and after the gold layer 106 has been evaporated upon the opposite side of the silicon wafer 10 and allowed slightly therewith to form an ohmic connection to wafer 10. Before applying gold layer 106 the underside of the assembly of FIGure 7 is subjected to a lapping operation which removes the silicon dioxide from the undersurface and reduces the thickness of the original silicon wafer to about 2 to 4 mils. This not only permits application of the gold layer, but also, by reducing the thickness of the silicon wafer, reduces the forward resistance of the rectifiers formed thereon.

As shown in FIGURE 9B, a plurality of additional and substantially identical rectifying contacts may be formed on the silicon simultaneously with the formation of elements 90, 92 and 94. These rectifier elements may be interconnected by appropriate micro-electronic techniques, or they may be separated from each other by cutting the assembly along the broken lines shown in FIGURE 9B to form individual single-rectifier units. Such a single unit is illustrated in section in FIGURE 10, after leads 108 and 110 have been attached in conventional manner, as by soldering or compression bonding, to the aluminum contact 102 on the epitaxially-grown region 92 and to the gold ohmic contact 106 on the underside of the silicon wafer, respectively.

As to the electrical characteristics of devices resulting from this process, FIGURE 11 is a graph in which positive ordinates represent reverse current and positive abscissae represent reverse voltage applied between the leads 108 and 110 of the device in FIGURE 10, forward-current being represented by negative ordinates and forward-voltage by negative abscissae. Dashed line A illustrates the typical characteristic of prior-art PN junctions produced by epitaxial-growth without subsequent surface treatment, and shows in the first quadrant a reverse-current which is relatively large even at low voltages and which gradually increases to extremely high values.

As shown by the full-line curve B, in a device produced by my process the reverse current is extremely low even for relatively high reverse-voltages up to a voltage $V_1$ at which breakdown occurs abruptly. The breakdown voltage $V_1$ is typically between 40 and 200 volts depending on the resistivity of the material used, and the reverse-current is of the order of 0.001 microampere at reverse voltages equal to 30% of the breakdown voltage. In addition the forward resistance of the diode is low, as shown by the steeply-flaling portion of line B in the third quadrant, becoming very low at forward voltages typically of about 0.5 to 0.7 volt.

Accordingly, while a prior-art rectifier made by epitaxial growth without subsequent surface treatment and having the characteristic A is useless for most practical purposes, a diode having the characteristic B and made by my process is excellent for commercial applications. The provision of these improved characteristics in my epitaxially-grown rectifier is believed to be due to the use of the epitaxial-growth process in the presence of silicon dioxide defining the regions in which growth occurs, whereby the periphery of the epitaxially-grown junction is passivated and protected by the silicon dioxide immediately upon formation and thereby prevented from exhibiting excessive leakage current when biased in the reverse-direction.

It will be understood that the foregoing detailed description is by way of example only and that the method is applicable to a wide variety of procedures so long as the epitaxial-growth is provided at least in part along the edge of a silicon dioxide layer on the silicon material. For example, the underlying silicon may be P-type or intrinsic, and the grown layer N-type or intrinsic. It is also possible by my method to produce a series of super-posed grown layers each having silicon oxide at its periphery. For example, the above-described device in the stage of fabrication shown in FIGURE 7 may be provided with a silicon-oxide layer covering the epitaxially-grown regions 90, 92 and 94, which silicon-oxide layer is then provided photolithographically with apertures exposing a portion only of each of the previously grown regions 90, 92 and 94; epitaxial-growth of an N-type region may then be provided in these latter apertures on the previously grown P-type silicon by the techniques referred to hereinbefore.

The result of this form of the process is to provide an epitaxially-grown N-P-N structure containing two rectifying barriers and suitable for use as a transistor.

While the invention has been described with respect to representative embodiments thereof, it will be understood that it is susceptible of embodiment in any of a wide variety of forms different from those specifically shown and described, without departing from the scope of the invention as defined by the appended claims.

I claim:

1. A method of forming a rectifying junction on silicon which comprises: forming on a body of silicon an adherent layer of an insulating oxide of silicon extending over a part only of said body so that a portion of said body is exposed; and epitaxially growing onto said exposed portion, and contiguous to the edge of said oxide layer, silicon of conductivity suitable for producing a rectifying junction with the underlying silicon body, while retaining said oxide layer during and after the epitaxial-growth formation of the rectifying junction.

2. A method according to claim 1, in which the epitaxial growth is performed by vapor deposition of silicon under conditions such that silicon is deposited only on the exposed portion of said body and not on said oxide layer.

3. A silicon rectifier comprising: a body of silicon; a layer of an insulating oxide of silicon adherent to said body and extending over a part only of said body; and a growth on the surface of said body composed of silicon of conductivity different from that of the underlying body, said growth being contiguous to, and extending beneath the edge of, said insulating oxide layer.

References Cited by the Examiner

UNITED STATES PATENTS

| | | | |
|---|---|---|---|
| 2,858,489 | 10/1958 | Henkels | 148—33.5 |
| 2,895,858 | 7/1959 | Sangster | 148—175 |
| 2,981,877 | 4/1961 | Noyce | 148—33.5 |
| 2,989,424 | 6/1961 | Angello | 148—33.3 |
| 3,025,589 | 3/1962 | Hoerni | 148—1.5 |
| 3,098,774 | 7/1963 | Mark | 148—175 |
| 3,114,663 | 12/1963 | Klerer | 148—33.5 |
| 3,156,591 | 11/1964 | Hale et al. | 148—175 |

HYLAND BIZOT, *Primary Examiner.*

DAVID L. RECK, BENJAMIN HENKIN, *Examiners.*

N. F. MARKVA, *Assistant Examiner.*